United States Patent [19]
Coblitz

[11] Patent Number: 4,833,634
[45] Date of Patent: May 23, 1989

[54] MULTIPURPOSE ADAPTIVE FILTER

[76] Inventor: David B. Coblitz, 5615 Bakersville La., Burke, Va. 22015

[21] Appl. No.: 847,222

[22] Filed: Apr. 2, 1986

Related U.S. Application Data

[63] Continuation-in-part of Ser. No. 444,661, Nov. 26, 1982, abandoned.

[51] Int. Cl.$^4$ ............................................. G06F 15/31
[52] U.S. Cl. ................................................ 364/724.19
[58] Field of Search ........... 364/574, 724, 825, 724.19, 364/724.12; 375/103; 358/36, 37, 158

[56] References Cited

U.S. PATENT DOCUMENTS

| | | | |
|---|---|---|---|
| 4,636,863 | 1/1987 | Kaizaki et al. | 358/36 |
| 4,646,153 | 2/1987 | Fukuda et al. | 375/103 |
| 4,674,062 | 6/1987 | Premerlani | 364/724 |

OTHER PUBLICATIONS

Jazwinski, "Adaptive Filtering", *Automatica*, vol. 5, pp. 475–485, 1969.
Glaser, "Signal–Detection by Adaptive Filters;" *IRE Trans. on Information Theory*, Apr. 1961, pp. 87–98.
Ahuja et al, "Variable Digital Filters," *IEEE Trans. on Circuits and Systems*, vol. CAS 27, #9, Sep. 1980 336–338.

*Primary Examiner*—Gary V. Harkcom
*Assistant Examiner*—Dale M. Shaw
*Attorney, Agent, or Firm*—Low & Low

[57] ABSTRACT

This rate dependent filter has a two-portion continuous filter function which optimizes noise filtering and minimizes detrimental lag or degradation characteristics. A first portion of the filter provides high filtering for low signal inputs below a first signal value. A second portion of the filter provides for a monotonically changing filter characteristic above the first signal values. The filter is especially useful in non-continuous transmissions, as radio, telephone, musical or other acoustical communication. It may also readily be applied to digital data transmission.

14 Claims, 5 Drawing Sheets

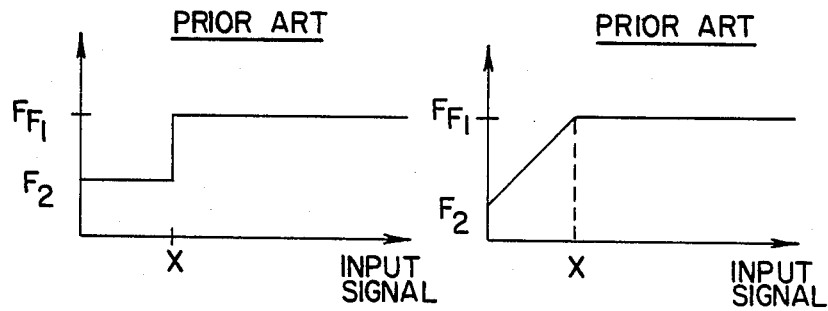
FIG. 1A PRIOR ART
FIG. 1B PRIOR ART
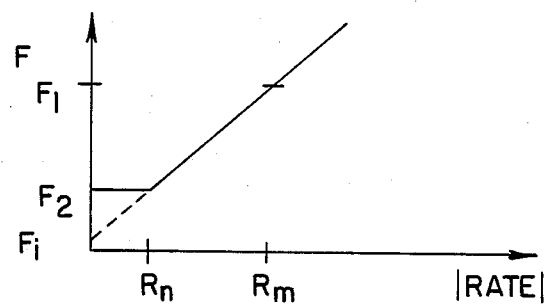
FIG. 2
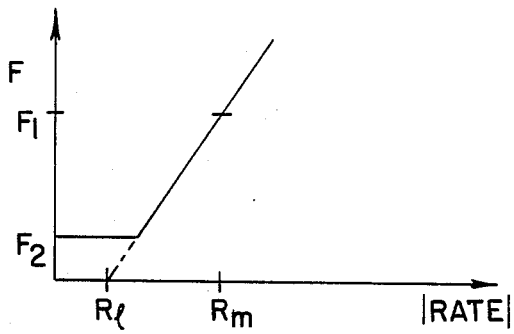
FIG. 3

4,833,634

MULTIPURPOSE ADAPTIVE FILTER

CROSS-REFERENCE TO RELATED APPLICATION

This application is a continuation-in-part of my prior Ser. No. 444,661, filed Nov. 26, 1982 entitled "Adaptive Filter", now abandoned.

BACKGROUND OF THE INVENTION

This invention relates to adaptive filters in which the amount of filtering varies as a function of a parameter of a signal.

A number of dynamic filters have appeared in the literature. U.S. Pat. No. 3,767,939 to Chamran et al discloses a system for automatically controlling the time constant of an electronic filter in response to the amount and rate of change in the input signal for values greater than a predetermined value. U.S. Pat. No. 3,946,211 to Jenkins represents a similar approach in which the filter time constant is controlled to one of two levels by the amplitude of the input signal being either above or below a preset amplitude limit. Both of these prior art patents then disclose a step-function type of filter constant arrangement, wherein the filter response is at one constant level below a preset input signal level and at another level above the preset input signal level.

A second prior art approach has been to replace the lower step portion of the above filters with a ramp which slopes linearly down from the upper step filter value of some maximum filter value at intersection of the filter function with the ordinate axis (see FIG. 1B). Nevertheless, the second approach suffers from the same shortcomings as the first; that is, undesirable trade-offs between amount of filtering and amount of lag introduced by the filtering.

However, in many applications, the simple filter functions of the prior art are not adequate. In certain systems, the ratio of signal to noise in the system is not a constant and requires sophisticated filtering. Attempts to apply the prior art two-step filter functions met with failure. A new filtering approach was clearly needed.

SUMMARY OF THE INVENTION

For a class of signals having a level of noise that is not dependent upon the level of the signal, but rather is a function of extraneous factors, it is possible to construct a filter that will adapt the amount of filtering it provides to retain a substantially constant signal to noise ratio. Thus, as the signal strength increases, the filter adaptation mechanism will detect the increase in signal strength and will reduce accordingly the amount of filtering to retain a constant signal to noise ratio. In addition, the amount of filtering will be limited to a maximum that is sufficient to reduce the noise to a level that is not objectionable. Thus, the signal level decreases, a point will be reached at which the corresponding filtering amount is necessary and sufficient to reduce the noise to an acceptable or undetectable level even for any lower signal levels. Beyond this point, no additional increase in filtering is required.

The adaptive filter of this invention has a filter characteristic which is a function of a parameter of the input signal, which parameter may be, illustratively, either rate or amplitude, and preferably comprises a two-portion continuous function. This first portion s characterized by a constant higher filter amount (lower filter value) below a first input signal value. There is a second portion in which the amount of filtering changes monotonically as a function of the input signal value above the first input signal level which marks the boundary of the first portion of the filter function. Simply put, one embodiment of the filter function can be regarded as a constant function with a ramp transition above a particular input level.

BRIEF DESCRIPTION OF THE DRAWINGS

FIGS. 1A and 1B are graphs showing prior art filter functions;

FIG. 2 shows a graph which depicts the filter value as a function of input signal rate for one embodiment of this invention;

FIG. 3 is a graph which shows the filter value as a function of input filter rate as a second embodiment of this invention;

DETAILED DESCRIPTION OF THE INVENTION

Figure 4:
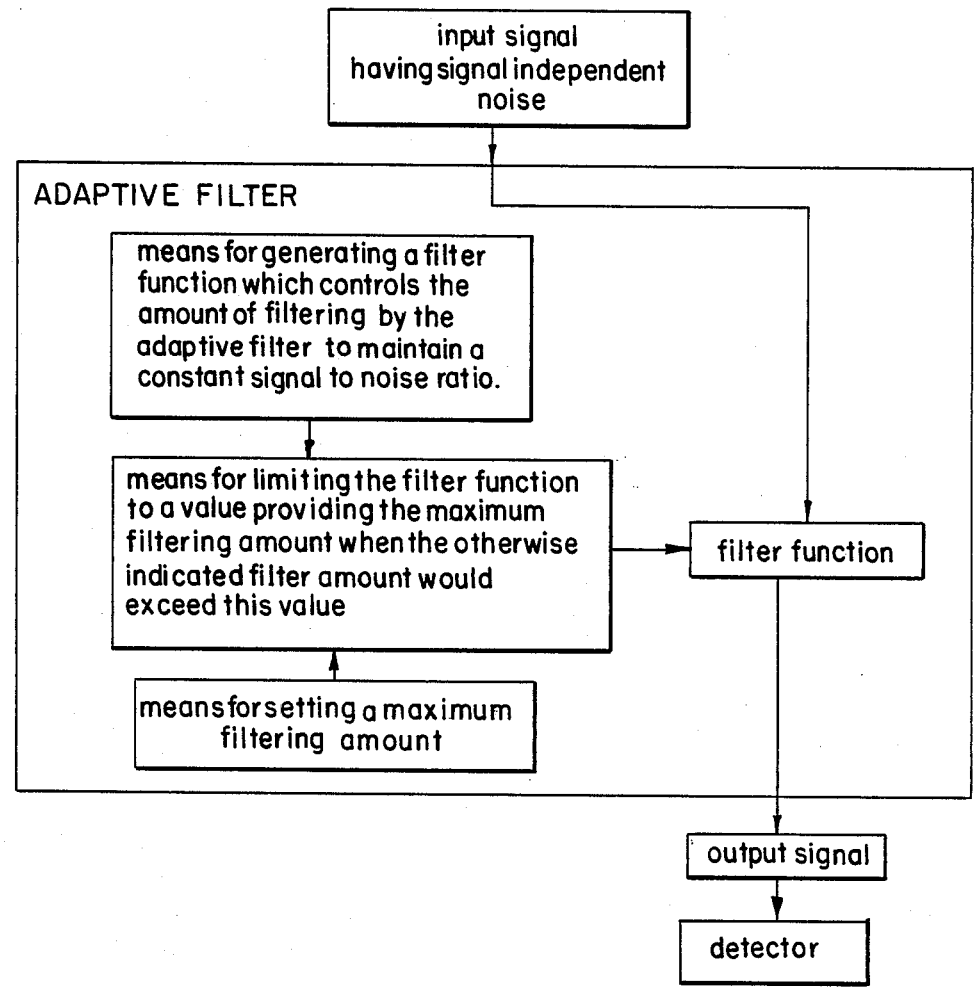
FIG. 4 is a diagrammatic illustration of the invention function.

In general, the filter function of this invention can be applied to any analog or digital data or signals which have both noise and non-linear components, illustratively, musical passages or acoustical communication including wide amplitude variations and periods of silence. Especial signal-to-noise variation may arise in utilities as mobile telephones or so-called "space" phones or wireless home telephones. Further, in environments such as "talk shows" or news media operations generally, relative movement of or between speakers or listeners, and their microphones make the instant invention desirable.

The greatly improved suitability of the adaptive filter of this invention compared to the prior art filter function is due to a common characteristic of the particular detector of the filtered signal, e.g., a sensory means as the ear or some equivalent electrical hardware, wherein such detectors have a tolerance to noise which varies with the detected signal amplitude or signal rate. For example, in an audio system such as a radio or phonograph, one does not notice a given level of noise at high signal levels, but will notice the same level of noise at smaller signal levels. Additionally, there is some absolute noise threshold level below which the noise will be not be heard regardless of signal amplitude or rate. To take advantage of this characteristic, the multipurpose adaptive filter of this invention filters noise continuously to levels below the threshold of acceptability for noise tolerance at relatively large signal levels, requiring only a relatively small amount of noise filtering. However, as the signal strength becomes smaller, reduction of the relatively constant noise requires increased filtering as the detector noise tolerance is lowered with the lowered signal rate. On the other hand, in the filter function of this invention, the increasing filtering does not increase beyond the point of the absolute noise tolerance threshold, since noise levels below this absolute threshold level will not be detected in any event. At or below this absolute noise threshold level, only the finite amount of filtering is required to reduce the noise to an acceptable level.

If the inherent noise in the given utility system is above a certain level, it is normal to filter the system output to reduce the noise. Unfortunately, this filtering process introduces a delay or other degradations into the output signal which is often intolerable or undesirable in a number of applications. Further, the prior art adaptive filters are limited to step function filters which use a two-level filtering characteristic which steps between levels at a preset input signal level. Unfortunately, this abrupt step usually falls in the critical portion of the input signals and either does not filter enough at the lower filtering rate or filters too much at the higher filtering rate and introduces too much degradation in the resulting output signal. In addition, step, or multiple step changes in filtering may produce detectable and undesirable changes in the filtered signal.

FIG. 1A shows a generalized graph of the prior art step function filter. The abscissa is some parameter of the input signal, commonly amplitude or rate, while the ordinate is a number, here labelled F, relating to the amount of filtering.

Note that in the following discussion the amount of filtering is inversely proportional to the actual numeric value of F. The terms maximum and minimum are used to refer to the amount of filtering and resultant lag rather than the numeric value of the term. Minimum filtering amount occurs when F approaches 1, and maximum filtering amount occurs when F=0.

The step function is shown with an initial value for the filter function of $F_2$ at input signal levels below the point, X, and with a filter value of $F_1$ for input signal levels above the step point, X. Further, the step change in filter function also introduces a corresponding step change in the amount of lag or other degradation. This is in itself may be noticeable and objectionable. FIG. 1B shows a generalized graph of another prior art filter function in which the lower step is replaced by a ramp. The ramp, of course, eliminates the abrupt transition between the two filter levels in the prior art filter function shown in FIG. 1A. FIG. 4 illustrates the functional flow of the multipurpose adaptive filter of the invention, and may be taken with FIGS. 2 and 3 discussed hereinafter.

The following detailed description may be instructive wherein the rate of change of signal input determines the filtering required. Moving to a mathematical treatment of the problem, let X be the raw data value to be filtered. Let $X_i$ be the $i^{th}$ sample of this data. Further, let $S_i$ be the $i^{th}$ filtered value of X. F is the filtering constant that determines the amount of filtering and, hence, lag in the output signal. F takes on values from 0 (infinite filtering) to 1 (minimal to no filtering) and, for this embodiment, is a function of the rate of change in the value, X. The absolute value of the rate of change is given by $|X_i - X_{i-1}| = RATE$. This RATE is shown as the abscissa in FIGS. 2 and 3.

Since RATE is derived from the noisy input values of X, if the true value of X were constant, various rates would still be generated by the noise. To simplify this discussion, assume that the noise will not generate any significant rates above a certain value which will be called the "noise equivalent rate" or absolute noise threshold level. Below that rate, assume that real rates are indistinguishable from noise. This noise equivalent rate is labelled as $R_n$ on the abscissa of FIG. 2. There will always exist an amount of filtering, $F_o$, that is necessary and sufficient to reduce the noise to an acceptable level. Since signal rates below the noise equivalent rate, $R_n$ are indistinguishable from zero, an amount of filtering at least as much as $F_o$ is required for all rates below this filter value. At or above some other rate, $R_m$, a minimum amount of filtering is required. These two points on the abscissa, $R_m$ and $R_n$, define a portion of the filter function whose slope is the rate at which filtering can be removed from the system. This is shown in FIG. 2. In addition, the values of $F_2$, $F_1$, $R_n$ and $R_m$ could be adaptive.

An alternative solution to the filter problem would be to extend the sloping portion of the filter function in FIG. 2 to intersect the ordinate axis at $F_i$. This is shown by the dashed line in FIG. 2 and corresponds to the prior art filters shown in FIG. 1B. However, this would require filtering below the noise equivalent rate, $R_n$, in an amount exceeding the maximum amount of filtering required to eliminate noise perception, $F_o$, which is $F_2$ in FIG. 2. The introduction of this increased filtering below the noise equivalent rate will add unacceptable lag distortion, or high frequency loss to the output signal and is not a satisfactory solution to the problem. When using a prior art filter in a practical application, the sloped portion of the filter function in FIG. 2 needed to be quite steep resulting in an $F_{max}$ which differed substantially from $F_o$. This unnecessary filtering at low input value causes tremendous loss in signal quality when abrupt change in signal occurs. The inflection point at ($R_n$; $F_2$) in the filter function of FIG. 2 eliminates this problem by providing for the constant filter value, $F_2$, below the noise equivalent rate, $R_n$. Note that the filter value $F_2$ corresponds to the $F_o$ discussed above, which is the filter value for the noise equivalent rate.

There are a number of implementations possible for the basic multipurpose adaptive filter of this invention. A first implementation is that displayed in FIG. 2. The filter function itself is defined by either of the following equations, preferably the latter:

$$F = \left[ [|X_i - X_{i-1}|]_{LOWCUT}^{\infty} \cdot SLOPE \right]_{F_{min}}^{F_{max}} \quad (1)$$

$$F = \left[ [|X_i - X_{i-1}|]_{LOWCUT}^{\infty} \cdot SLOPE + CONST \right]_{F_{min}}^{F_{max}} \quad (2)$$

The LOWCUT limit will normally be set to the noise equivalent rate such that at lower rates no more filtering than the maximum required ($F_o$) filtering occurs. The $F_{max}$ and $F_{min}$ limits correspond generally to F2 and F1 for FIG. 2. Note that the extended slope portion of the function which intersects the ordinate at $F_i$ is presented for discussion and comparison purposes only and is not relevant to the discussion of the equation immediately above. This filter function is then applied to the following iterative expression to produce a filtered output $S_i$.

$$S_i = S_{i-1} + F(X_i - S_{i-1})$$

A second implementation is displayed in FIG. 3. This particular filter function is expressed by the equation below:

$$F = [\text{SLOPE} \cdot (\text{RATE} - \text{LOWCUT})] \, _{F_{min}}^{F_{max}} + F_{max} \quad (3)$$

In this equation, as in equation (1) of the first implementation, SLOPE is the algebraic slope of the ramp portion of the function. $RATE = |X_i - X_{i-1}|$, and in the second equation, CONST is a constant which is the intercept of the intermediate portion of the filter function. LOWCUT in this implementation is different from the first implementation in that it is found at point $R_L$ abscissa. This is at the projection of the sloping ramped portion rather than vertically below the inflection point, as was $R_n$ in the FIG. 2. $F_{max}$ and $F_{min}$ min correspond to $F_2$ and $F_1$ respectively in FIG. 3. The filter function is then substituted into the iterative expression below.

$$S_i = S_{i-1} + F \cdot (X_i - S_{i-1})$$

Figure 5:
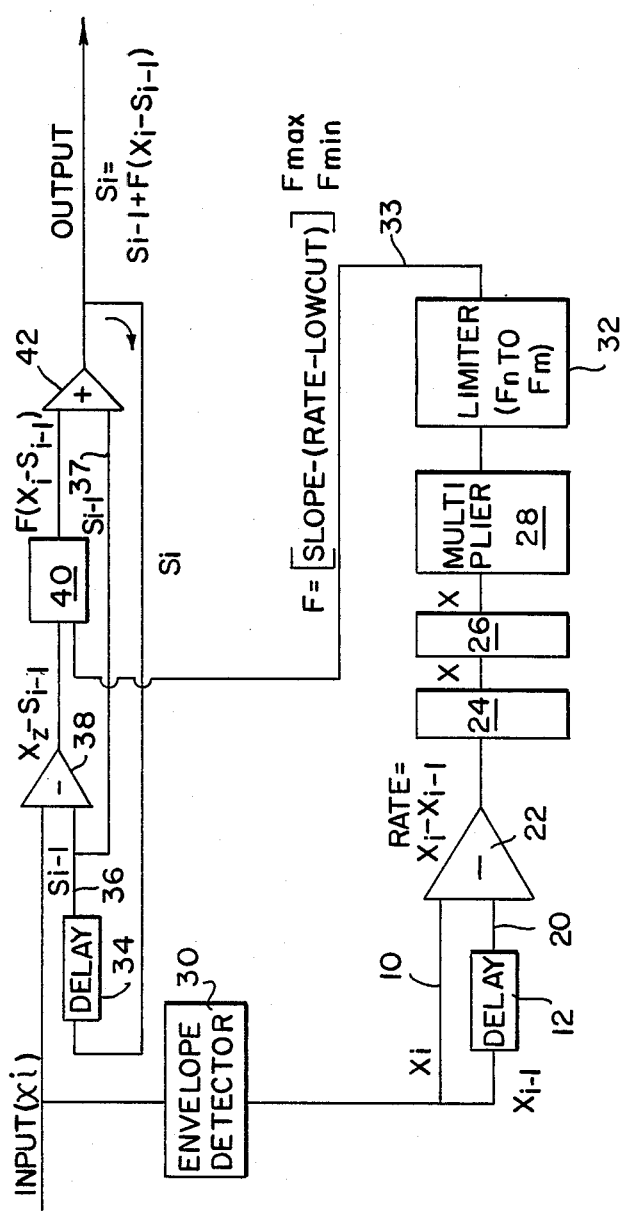
FIG. 5 is a block circuit diagram showing an analogue implementation of this invention.

A block diagram of a circuit for the solution of the equation immediately above is presented in FIG. 5 and references to the above equations are noted thereon. The input, $X_i$, is directed to a difference amplifier 38 and an envelope detector 30. The envelope detector for this embodiment essentially prefilters the input signal to the downstream decision-making circuitry in the lower loop of FIG. 5. B ally its function is to move rapid oscillations in the signal introduced by a carrier frequency. The output of the envelope detector 30 is conducted to a second difference amplifier 22 and to a delay means 12 to produce the previous input value, $X_{i-1}$. The output of the difference amplifier 22 is conducted to an absolute value determiner 24. The output of 24 is conducted to a low cut limiter 26 and from there to a variable gain means 28. Multiplier 28 multiplies its input values by slope values descriptive of the ramp portion of the filter function. The output of the multiplier 28 is conducted to a limiter 32 which converts the values of F above $F_{min}$ and below $F_{max}$ to the required constant values. This F output is conducted over line 33 to block 40 which is a multiplier having as its other input the output of difference amplifier 38. Difference amplifier 38 has as its inputs input line $X_i$ and the output of delay block 34 from line 36 which is the fed back previous output signal from the previous output signal $S_{i-1}$. This same delayed output from the previous cycle is also conducted along line 37 to summing amplifier 42. The output of block 40 is then the term $F(X_i - S_{i-1})$. The output of block 40 forms the other input to summing amplifier 42. The output of summing amplifier 42 is then the desired output of the system, $S_i$.

Figure 6:
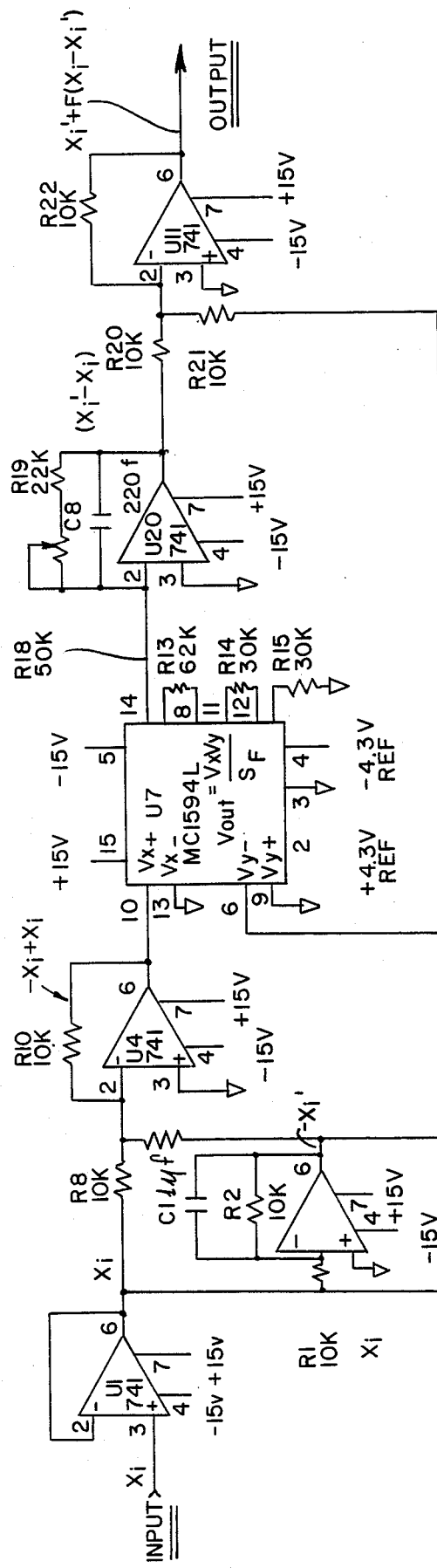
FIG. 6 is a circuit diagram showing a particular implementation of the invention.
Figure 6:
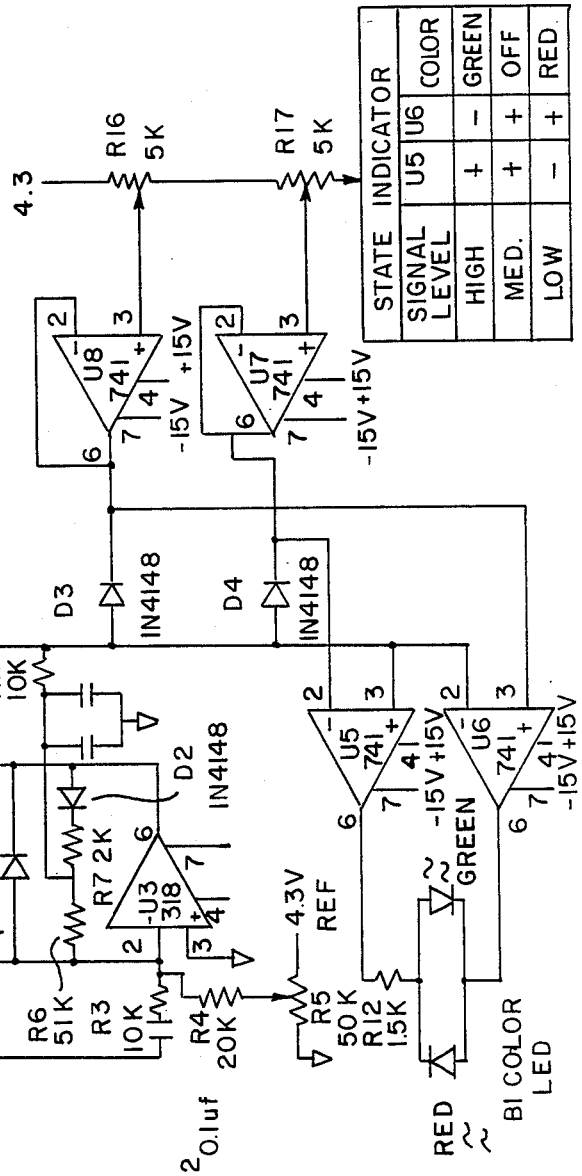

FIG. 6 illustrates an example of a further detailed circuit within the inventive concept and in many respects is similar to FIG. 4. The FIG. 6 arrangement is specifically adapted as an audio filter for use in the environments noted wherein the subject multipurpose adaptive filter is beneficial. As seen in the lower left-hand portion of FIG. 6, the same may include LED indications of signal level to aid the user of the audio filter system in setting the filter parameter values.

The filter function discussed above is adaptive relative to a parameter of the input signal, which for the above detailed description was converted to signal rate of change. The $R_n$ and $R_m$ points mark the inflections for the filter function, being respectively the absolute noise threshold level and the level beyond which a minimum acceptable filtering level may be used. It should be noted that, although the specific filter function developed above comprises straight-line or linear portions, a more generalized filter function could be constructed according to this invention which is not limited to straight-line portions or abrupt inflection points as in this specific example, but may be a logarithmic curve or other curve. Indeed, the only significant requirement as to the shapes of the portions is that the inflection points or transitions between the portions of the continuous filter function correspond substantially to the values of the input signals which are the absolute noise threshold level and if desired the minimum acceptable filtering level points. In other words, the curve describing the filter function does not necessarily have to be piecewise linear, but could be a higher function having the same inflection points.

The values of the absolute noise threshold level and the particular form of the sloped, intermediate portion of the filter function may themselves be adaptive. Thus, for instance, our basis for adaptation for these values can be the average noise level in the system measured over a relatively long time period. Also, the adaptivity need not be applied to all variables, but illustratively can be limited to only the minimum acceptable filtering level or absolute noise threshold level.

The filter function of this invention can be readily generalized to include various input signal parameters as the independent variable. For example, input signal magnitude or input signal phase could be the independent variable upon which the filter value depends. The general concept of the adaptive filter function of this invention can be implemented in digital and analogue configurations to at least any of the following applications: acoustic signals (e.g., audio equipment such as radio, telephones, or musical); video signal processing; CRT deflection signal processing and chart recorders, among others.

Figure 7:
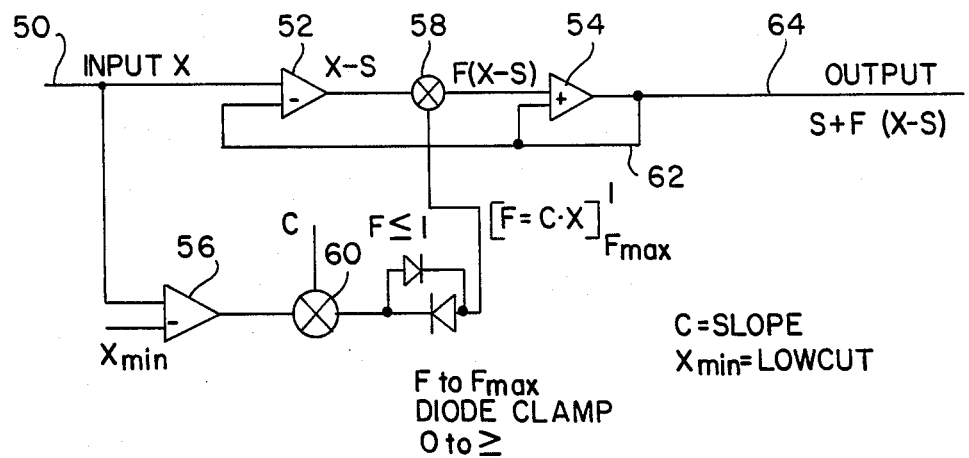
FIG. 7 is a block diagram showing an implementation of the invention utilizing amplitude as the control parameter.

Thus, as noted in FIG. 7, the principles of the invention may be applied in an improved and effectively simplified manner to and adaptive circuit which is amplitude-based as the input parameter—rather than based on rate or other parameters. Accordingly, as seen in FIG. 7, input at 50 is directed through difference amplifiers 52, 54, 56 and connected multipliers 58, 60 with subtractions through line 62 to produce the output at 64. The graph seen in FIG. 8 of the filter function of the FIG. 7 circuit is quite similar to that shown in FIGS. 2 or 3, essentially substituting an amplitude parameter for rate.

Figure 8:
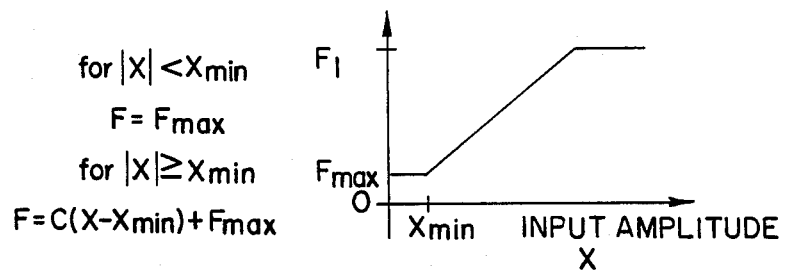
FIG. 8 is a graph depicting the filter value as a function of amplitude.

For reference, then, and with regard to FIGS. 7 and 8, the equation at (3) for FIG. 3 is slightly revised; thus:

for $|X| < X_{min}$ $F = F_{max}$;

for $|X| \geq X_{min}$ $F = C(X - X_{min}) + F_{max}$ where $X_{min} = \text{LOWCUT}$ and $C = \text{SLOPE}$.

What is claimed is:

1. An adaptive filter for removing noise from signal inputs emanating from consumer-oriented acoustical and like sources, comprising, a filter device having an input connection to receive a said signal input, said device having means for providing a two-portion, continuous filter function wherein the instantaneous value of the filter function is a function of a parameter of the input signals, and in which:

said means provides the first portion of said filter function with a constant, predetermined lower filter value for input signal parameter values blow a first, lower signal parameter value;

said means provides the second portion of said filter function with a slope in which the filter value changes monotonically above the said lower filter value as a function of the input signal parameter values above the first signal parameter value such that the average slope of the second portion is less than infinite, and, means for applying a said input signal to said filter device.

2. The filter of claim 1 wherein the parameter is the absolute value of the rate of change of the input signal.

3. The filter of claim 2 wherein the first, lower signal parameter value is a noise equivalent rate defined as that rate below which increased filtering does not result in a significantly perceptible decrease in detected noise.

4. The filter of claim 1 wherein the lower signal parameter is the amplitude of the input signal.

5. The filter of claim 4 wherein the first, lower signal parameter value is an amplitude level defined as that below which increased filtering does not result in a significantly perceptible decrease in detected noise.

6. The filter of claim 1 wherein the lower signal parameter is the first derivative of the amplitude of the input signal.

7. The filter of claim 1 wherein the value of at least one of the group consisting of the lower filter value and the monotonically changing function describing the slope filter value is adaptive, wherein said adaptation is a function of the average level of noise present in the input signals measured over a relatively long period of time.

8. The filter of claim 1 implemented in a system involving acoustical signals wherein the value of the higher filter value of the monotonically changing function of the slope filter value is adaptive, wherein such adaptation is a function of the acoustical source with respect to a detector therefor.

9. The filter of claim 8 wherein said acoustical signals include oral communication.

10. The filter of claim 8 wherein said acoustical signals include music.

11. The filter of claim 8 wherein said acoustical signals range in a random pattern between a high level and zones of silence of zero level.

12. The filter of claim 1 in which the two-portion continuous filter function provided by the said means is algebraically described by $$F = \left[ [|X_i - X_{i-1}|]_{LOWCUT}^{\infty} \cdot SLOPE + CONST \right]_{Fmin}^{Fmax}$$

where
F is the filter value and F is limited between a selected lower value and a selected higher value,
X is the input signal, and $|X_i - X_{i-1}|$ is the rate of change of the said input signal,
LOWCUT is a noise equivalent rate, determining the selected lower filter value on the SLOPE and thus said first filter function portion,
SLOPE is the algebraic slope of the second portion of the filter function, and
CONST is the filter value which would result if the algebraic function describing the linearly sloping portion of the filter function were solved for a rate of zero.

13. The filter function of claim I in which the two-portion continuous filter function provided by the said means is algebraically described by $$F = [SLOPE \cdot [(|X_i - X_{i-1}|) - LOWCUT]]_{Fmin}^{Fmax}$$

where
F is the filter value and F is limited between a selected lower value and a selected higher value,
SLOPE is the algebraic slope of the second portion of the filter function,
$F_{max}$ serves to clip the expression value and define the first filter function,
X is the input signal, and $|X_i - X_{i-1}|$ is the rate of change of the said input signal,
LOWCUT is the signal rate value which would result if the algebraic function describing the second linearly sloping portion of the filter function were solved for a filter value of 0.

14. The filter function of claim 1 in which the continuous filter function provided by the said means is described by $$F = C(X - X_{min}) + F_{max}$$

wherein
F is the filter value,
C is the SLOPE,
X is the input signal,
$X_{min}$ is the signal rate (or LOWCUT) value which would result if an algebraic function describing the second linearly sloping portion of the filter function were solved for a filter value of 0, and
$F_{max}$ is the lower filter value.

* * * * *